United States Patent [19]

Lin

[11] Patent Number: 5,627,463
[45] Date of Patent: May 6, 1997

[54] AUTOMATIC MULTI-FUNCTION TESTING MACHINE FOR ELECTRIC APPLIANCES

[76] Inventor: Jui-Pin Lin, P.O. Box 90, Tainan 704, Taiwan

[21] Appl. No.: 600,068

[22] Filed: Feb. 12, 1996

[51] Int. Cl.⁶ .............................. G01R 31/02; G01R 33/00
[52] U.S. Cl. ..................... 324/158.1; 324/72.5; 324/73.1
[58] Field of Search ............................... 324/158.1, 72.5, 324/73.1

[56] References Cited

U.S. PATENT DOCUMENTS

| | | | |
|---|---|---|---|
| 5,331,273 | 7/1994 | Schneider | 324/158.1 |
| 5,510,705 | 4/1996 | Langrish | 324/158.1 |

*Primary Examiner*—Ernest F. Karlsen
*Assistant Examiner*—Barry C. Bowser

[57] ABSTRACT

A automatic multi-function testing machine for electric appliances includes an oval annular testing table, carriers moving around on the table for carrying electrical appliances to be tested, various testers and meters fixed on a gauge panel located on an oval support base located inside the table, a first electric rail annularly located near the peripheral edge of the oval support base and insulatingly separated into five stages. Each stage is electrically connected with one of the testers and the meters on the gauge panel. Each carrier has two brushes contacting and sliding under the first rail and a socket to connect with a plug of an appliance thereon. So the appliances are tested separately by all the testers and measured by the meters in a flowing system, when moved around with the carrier on the table for one round.

5 Claims, 4 Drawing Sheets

# AUTOMATIC MULTI-FUNCTION TESTING MACHINE FOR ELECTRIC APPLIANCES

BACKGROUND OF THE INVENTION

This invention concerns an automatic multi-function testing machine for electric appliances, particularly requiring only one worker and largely shortening the time needed for testing many kinds of characteristics.

Generally, electric appliances pass through a series of various tests so as to be provided with quality good enough to be used by consumers before manufacturers send them in market. In conventional testing procedure, a worker at every testing station manually connects contacts of an electric appliance with those of a tester or a meter for one item, with considerable time for testing needed. The more the testing items are, the more the workers are needed. For example, an electric appliance such as a rice cooker should be tested of temperature condition, pressure endurance, insulation, resistance, and power consumed, through the following conventional steps.

1. Temperature test: In this test, electric power of 100 V, 11o V, or 200 V is supplied through the plug of a rice cooker, with two contacts of the cooker being used as testing contacts. Then a temperature sensor is placed inside the cooker, which is then rapidly heated up, letting temperature rise up to a pre-set highest value to to see if a temperature switch of the cooker is readily turned off or not. And it should be tested whether the cooker can be heated up to the desired temperature within a a pre-set period of time, and whether the temperature at turning off of the temperature switch is within permitted scope of error or not.
2. Pressure endurance test: In this test, the rice cooker is not to be powered, but two testing contacts of a pressure tester are to be connected with the two contacts of the rice cooker, with one of them being a metal housing of the cooker and the other being a heater of the cooker (practically the two contacts of the plug of the cooker). Then the pressure tester will indicate the result, the tested value, and it will give out a shrill sound as a warning, if the tested pressure endurance is below the pre-set one.
3. Insulation test: In this test, the cooker is not to be powered, and as the same process in the presure endurance test, two contacts of an insulation tester are to be connected with the two contacts of the cooker. Then the insulation tester will show the result, the tested value.
4. Resistance test: In this test, the cooker is also not to be powered, but the two testing bars of a three-purpose meter are made to contact with the two contacts of the cooker, and the three-purpose meter adjusted to resistance testing will indicate the result, tested value of resistance of the cooker.
5. consumed power test: In this test, the cooker is to be powered, and a watt meter is connected between the cooker and AC power, as a conventional well-known way. The two contacts of the cooker is also the plug of the cooker.

As understood from the above description of the conventional testing procedure, in each stage of testing connecting work of the contacts of the appliance to be tested with those of a tester or a meter has to be done manually, requiring considerable time. In addition, though rice cookers are carried automatically on a conveyer from one testing station to another one, a proper distance should be made to cope with different time needed for each testing. Then not a little time would be wasted in the whole testing.

SUMMARY OF THE INVENTION

A main object of the present invention is to offer a automatic multi-function testing machine for electric appliances, able to carry on various tests needed by only one worker and to shorten time needed in those tests in a great degree.

A main feature of the invention is an oval annular testing table, a plurality of carriers with ball feet for transporting electric appliances to be tested and conveyed around on the testing table, a oval support base located inside the testing table with an annular aperture between them, a gauge panel located on the oval support base, various testers and meters such as a pressure tester, an insulation tester, etc., fixed on the on the gauge panel. A first set of electric rail is annularly provided under the oval support base in a very near vicinity of the moving route of the carrier. The first electric rail is divided into five stages insulatingly separated and electrically connected with one of the testers and the meters. Each electrical appliance carried on one of the carriers has its plug inserted in a socket on each carrier, electrically connected with two brushes located and sliding under the load rail when the carrier is moved around on the testing table. So when the carrier with the electric appliance therein is moving on one of the five stages of the first rail, the relative tester or meter will indicate the result of the testing value to be seen by the worker sitting in front of the gauge panel. So the appliance on each carrier finishes all tests when it moves one round on the annular testing table.

BRIEF DESCRIPTION OF DRAWINGS

This invention will be better understood by reference to the accompanying drawings, wherein.

DESCRIPTION OF THE PREFERRED EMBODIMENT

Figure 1:
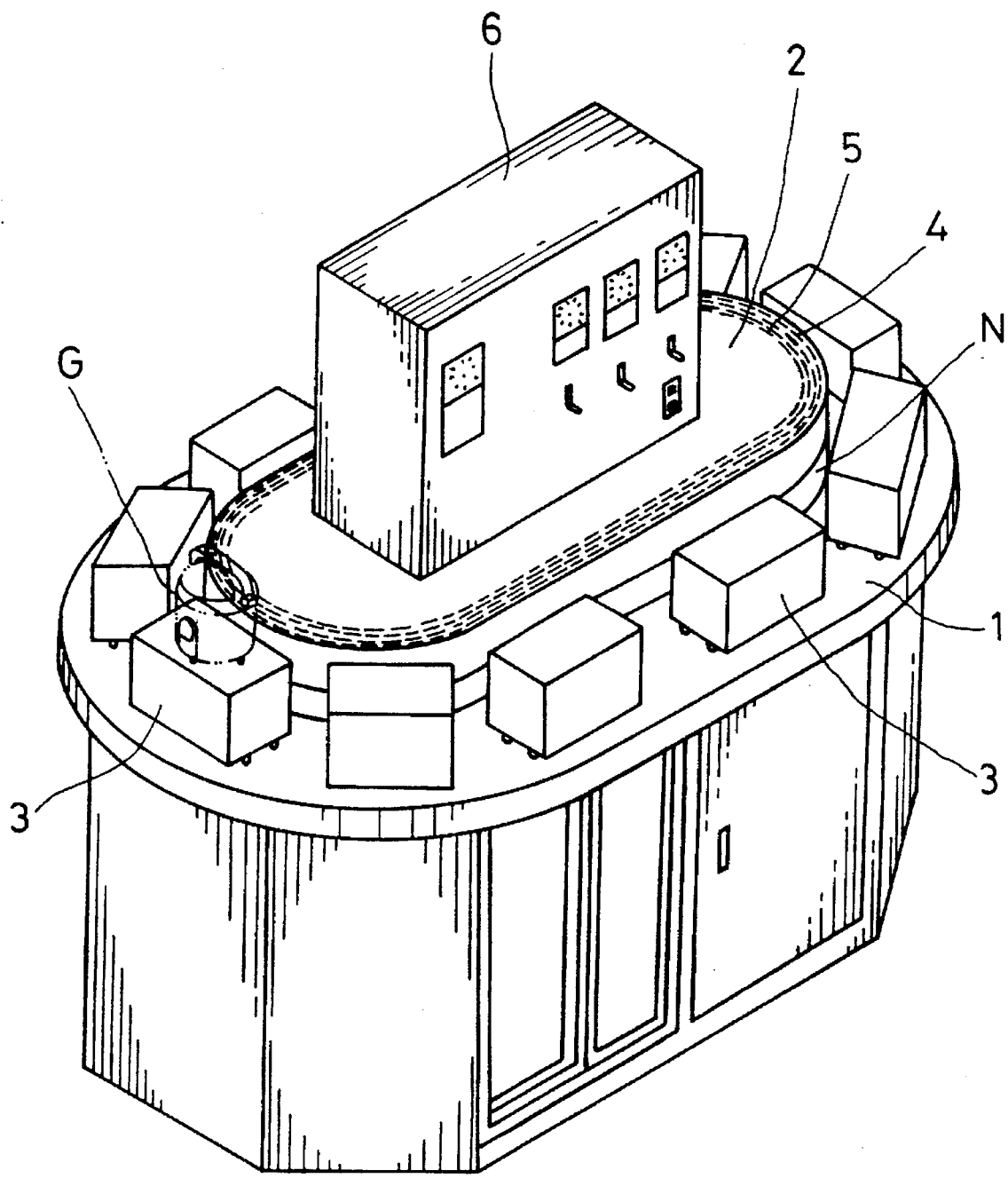
FIG. 1 is a perspective view of a multi-function testing machine for electric appliances in the present invention.
Figure 2:
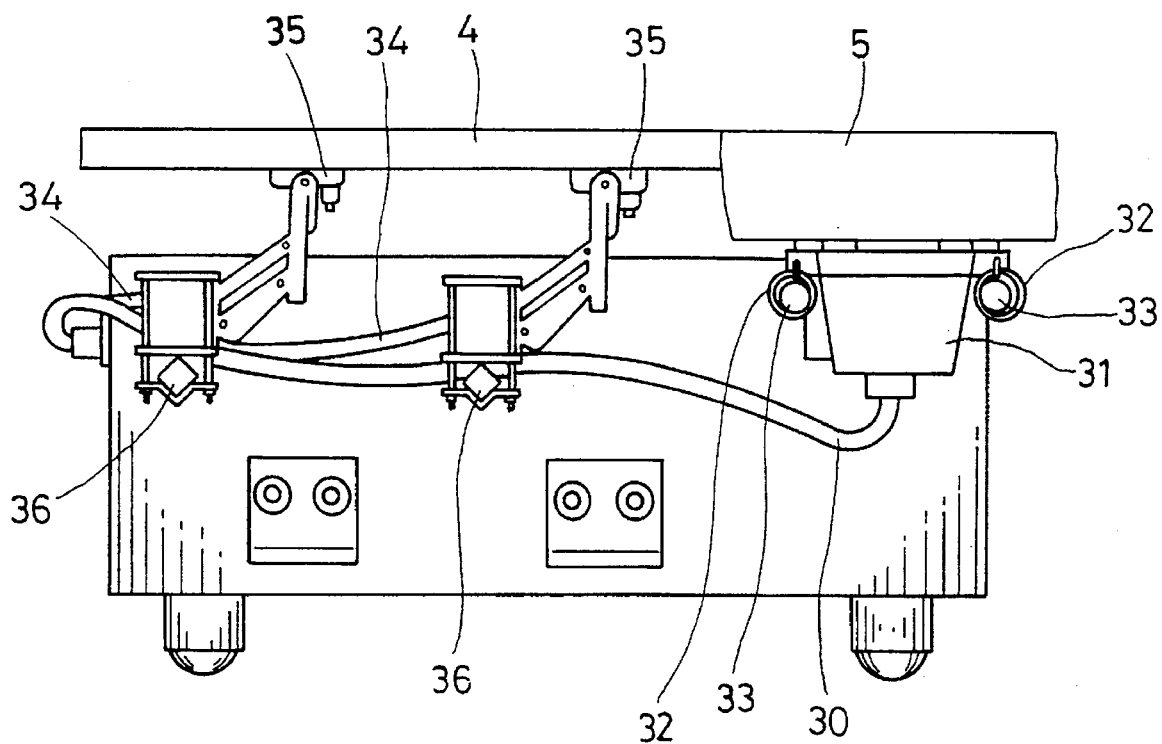
FIG. 2 is a flat elevational view of brushes of a carrier electrically connected with a first electric rail and a second electric rail in the present invention.

An automatic multi-function testing machine for electric appliances in the present invention, as shown in FIG. 1, includes an oval annular testing table 1, a oval support base 2, a plurality of carriers 3, a first electric rail 4, a second electric rail 5, and a gauge panel 6, as main components combined together.

The oval annular testing table 1 has an upper flat surface for placing the carriers 3 spaced apart equidistantly and be moved thereon by means of a moving mechanism.

The oval support base 2 is located the center space defined by the oval annular testing table 1, located higher than the table 1 with an annular aperture N of proper width between them.

The plurality of carriers 3 are placed on the upper flat surface of the oval annular testing table 1, used for carrying an electrical appliance to be tested on each of them. Each carrier 3 has ball feet to move on the table 1.

The first electric load rail 4 is fixed on the bottom surface of the outer peripheral annular portion of the oval support base 2, in a very near vicinity of the inner annular edge of the testing table 1. The first electric load rail is further divided into five stages 40, 41, 42, 43, 44 insulatingly separated from each other.

The gauge panel 6 is fixed to stand on the oval support base 2, with plural testers and meters deposited in its interior with the front surfaces of the testers and meters exposed in the front surface of the gauge panel so as to be seen by a worker sitting in front of the panel 6.

Each carrier 3 has a socket fixed on its upper surface for the plug of an electric appliance to insert, for example, a rice cooker. The carrier 3 also has a temperature testing and displaying circuit related with a temperature sensor which is to be placed in the rice cooker for sensing the temperature in the cooker in testing. For testing temperature, a cable 30 is provided to be led out of a side of the carrier 3 through the aperture N shown in FIG. 1, having its one end connected with a brush holder 31. On two opposite sides of the brush holder 31 is respectively provided a ring 32 which is to be inserted and secured in place by a U-shaped post 33 projecting from the inner side of the carrier 3 so that the top of second brushes 310 held by the brush holder 31 may be kept in contact with the bottom surface of the lines of the second electric rail 5.

Figure 3:
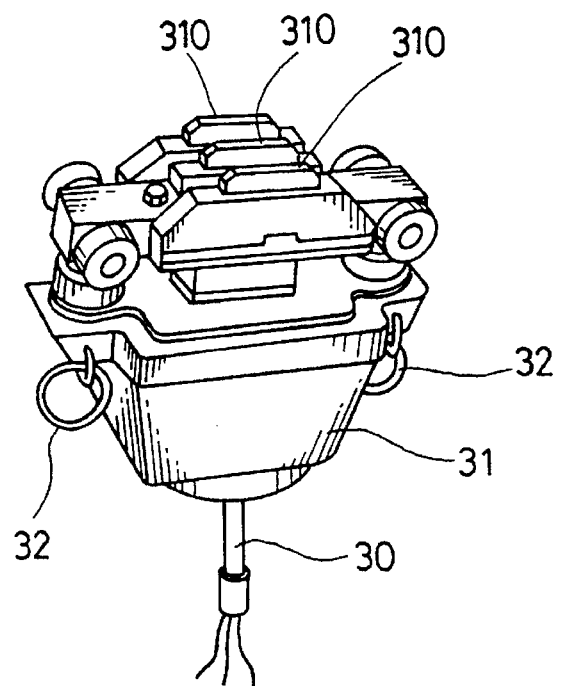
FIG. 3 is a perspective view of a second brush under the second electric rail in the present invention.

The brush holder 31 has a structure shown in FIG. 3, having three parallel second brushes 310 on top and elastically urged upward by springs so that the brushes 310 may be kept in good contact with the second electric rail 5 of three lines, with two lines for the power needed for testing and the other one for connecting with the ground. But the number of the lines can be increased according to practical necessity.

When the plug of a rice cooker being tested is connected with the socket of a carrier 3, it means that the rice cooker is practically electrically connected with two lead wires 34 coming out of the carrier 3, and the two lead wires 34 passing through the aperture N are connected with a pair of brushes 35, which are in contact with the bottom surface of the first electric load rail 4 of two lines. The brushes 35, 35 are respectively fixed on two square posts 36, 36 projecting from an inner side of the carrier 3, so the brushes moves together with the carrier 3 when the carrier 3 is moved.

Figure 4:
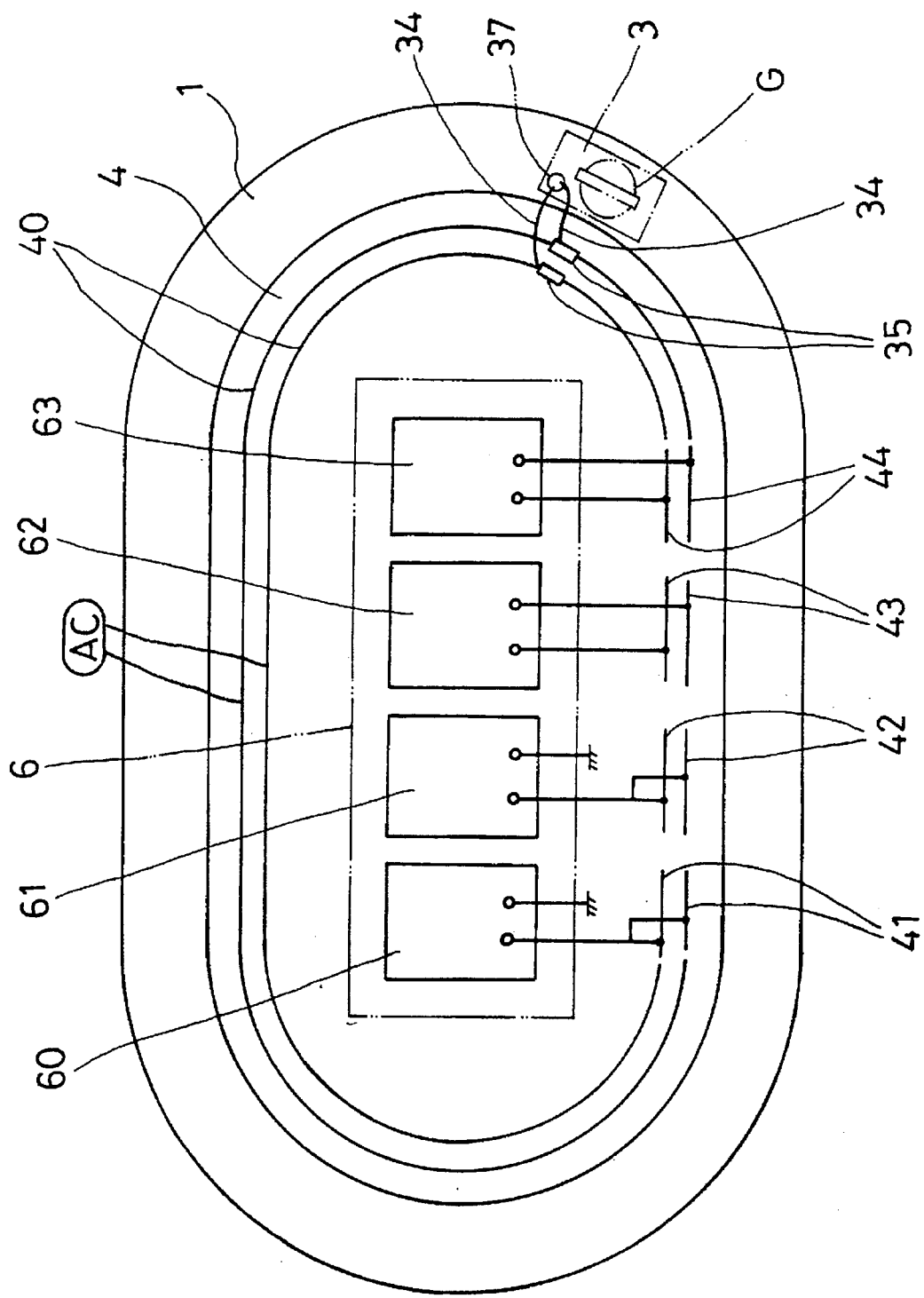
FIG. 4 is a diagram of wire connections of a rice cooker, the carrier, the first and the second electric rail and the gauge panel in the present invention.

However, In place of two test contacts needed for every testing station in the above-mentioned traditional testing procedure for a rice cooker, this invention uses the first electric load rail 4 having the five testers and meters or power, as shown in FIG. 4, getting rid of manual transporting job of flowing test system and arranging various meters such as a pressure tester 60, an insulation tester 61, three purpose meters 62 for resistance, a watt meter 63, etc. And the gauge panel 6 is located to be surrounded by the annular testing table 1 around and on which the carriers 3 are moved. In carrying on testing a plurality of rice cookers G, each cooker G is placed on each carrier 3, with the plug of the cooker G inserted in the socket 37 of the relative carrier 3. And the socket 37 is connected with the two brushes 35, 35 connected with two lead wires coming out of the carrier 3.

When the plug of a rice cooker G is inserted in the socket 37 of a relative carrier 3, it means that the two contacts of the plug are connected with the first electric rail 4. Besides, the first rail 4 is divided into a plurality of stages, for example five, for testing five items. And the five stages 40, 41, 42, 43, 44 are electrically insulated from one another, wherein;

(1) A first stage 40 of the first rail 4 is the longest of all the stages and used for temperature test, cooperating with the heating time, connected with AC of 100 V, 110 V or 200 V, etc. depending on necessity;

(2) A second stage 41 of the first rail 4 is electrically connected with the pressure tester 60;

(3) A third stage 42 of the first rail 4 is electrically connected with the insulation tester 61;

(4) A fourth stage 43 of the first rail 4 is connected with two testing bars of the three-purpose meter 62;

(5) A fifth stage 44 of the first rail 4 is connected with the output terminal of the watt meter 63.

When each carrier 3 passes each of the five stages 40, 41, 42, 43, 44 of the first rail 4 in moving on the testing table 1, the rice cooker G on each carrier 3 will be tested in the order as follows.

1. Temperature test: The plug of the rice cooker G is to be inserted in the socket 37 of the carrier 3 after the cooker G is placed thereon, and a temperature sensor is to be placed in a proper point in the cooker G as well. So while the carrier 3 is moved on the first stage 40, the cooker G is heated up by AC flowing through the first stage 40 and the brushes 35, 35 to the two contacts of the plug of the cooker G. If the temperature of the cooker G reaches a pre-set turning off value before the carrier 3 leaves off the first stage 40, the AC is to be turned off, and a person at testing has to watch the shown temperature on the temperature meter if it agrees with the pre-set limit one or not or not.

2. Pressure enduring test: In passing movement of the carrier 3 through the second stage 41 of the first rail 4, the plug of the rice cooker G is connected with the second stage 41 of the first rail 4, the two lines of which are in advance short-circuited and then connected with one testing bar of the pressure tester 60, with the cooker G being attached with a conducting clamp having two ends respectively electrically connected with a metal housing of the cooker G and an outer shell of the carrier 3 grounded, as the outer shell is connected with one line of the second rail 5 grounded by means of the cable 30. It is evident that the other testing bar of the pressure tester 60 is also grounded so that the two testing bars are connected with the housing and the heater of the cooker G so as to actuate the pressure tester to indicate the result.

3. Insulation test: In this test, two testing bars of the inlulation tester 61 have to be connected in the same way as the pressure tester. In moving process of the carrier 3 along the third stage 42 of the first rail 4, the rice cooker G receives insulation test by the insulation tester 61, which then shows the result.

4. Electric resistance test: When the carrier 3 with the brushes 35, 35 moves along the fourth stage 43 of the first rail 4, two testing bars of the three-purpose meter 62 are connected with fourth stage 43 of the first rail 4 and also at same time with the two contacts of the plug of the cooker G, i.e. two contacts of the heater of the cooker G. Then the meter will indicate the result, electric resistance value.

5. Consumed power test: In moving process of the carrier 3 along the fifth stage 44 of the first rail, the watt meter 63 will show the result, consumed power by the cooker G, by the same connecting way as the item 3, 4.

As can be understood from the above description, the automatic multi-function testing machine for electric appliances in the present invention adopts a kind of testing method by means of brushes, rails, a testing and carries carrying electric appliances and automatically moving around on the testing table along the five stages of the first rail so that separated testing of various characteristics may be automatically performed and shown in various testers and meters on the gauge panel, without necessity of manual transporting of electric appliances to be tested.

Fundamental function of the carriers 3 is to connect electrically electric appliances such as rice cookers G automatically electrically connected with each stage 40, 41, 42, 43, 44 of the first rail 4 through the brushes 35, 35. If temperature test carried out with the first stage 40 of the first rail 4 is needed, each carriers 3 has to be additionally provided with a relative circuit for temperature testing. If an electric appliance has a resistance or electric inductive components is to be tested, testing items would be pressure endurance, insulation, resistance, consumed power, etc., but temperature test is not necessary. Then the second rial 5 for the relative circuit for temperature testing is consequently unnecessary, removable from this machine. So one more line is to be added to the first rail 4 so as to be connected with the ground, and subsequently one more brush 35 is to be added at the same time for a testing bar of the pressure tester and the insulation tester.

Figure 5:
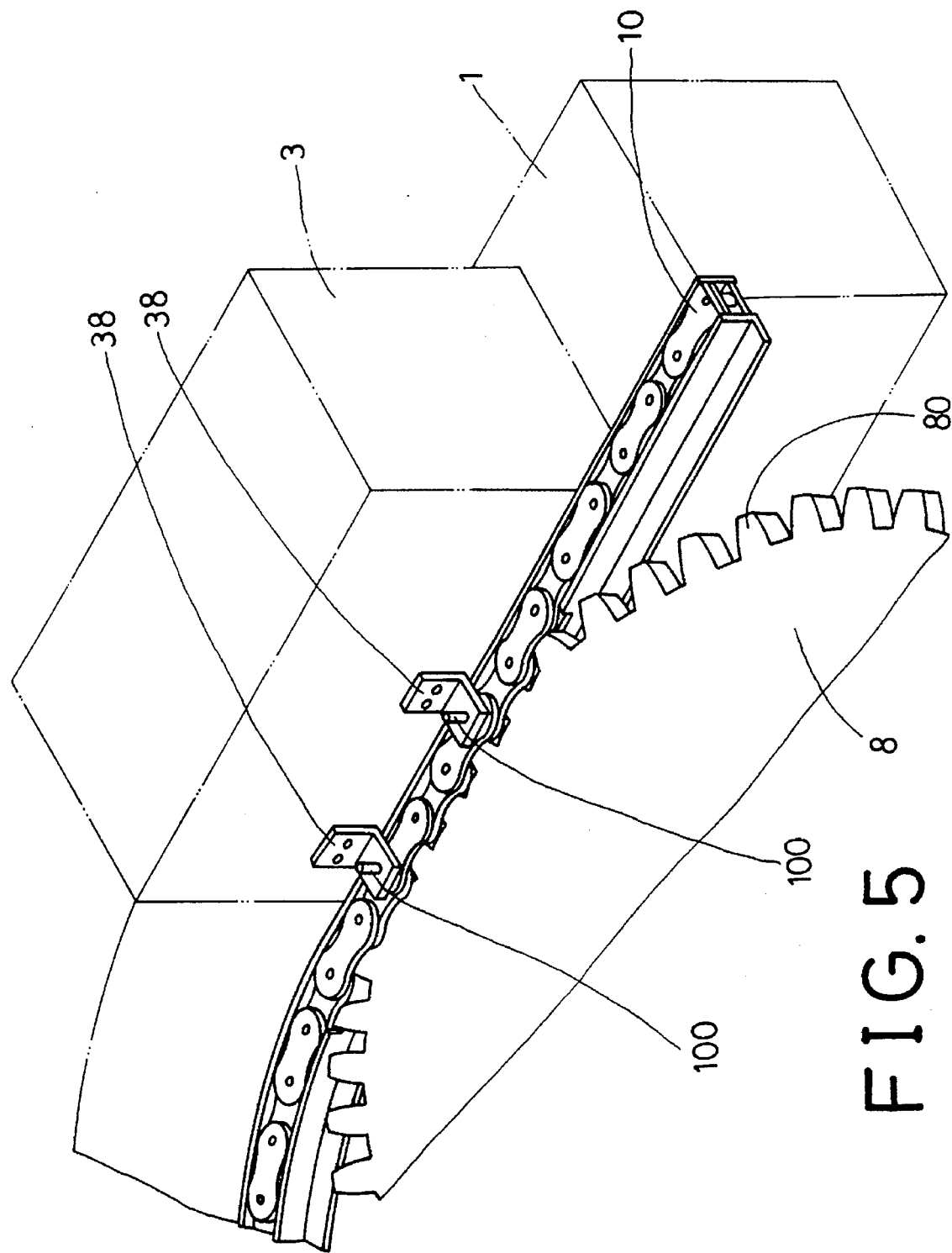
FIG. 5 is a perspective view of the relative position of the carrier and a chain and a chain gear in the present invention.

In order to move the carriers 3 around annularly on the testing table 1, as shown in FIG. 5, a moving mechanism is provided, including an endless chain 10 provided on an inner peripheral edge of the testing table 1 and a chain gear 8 having teeth 80 to engage with so that the chain 10 may be moved in one direction annularly on the table 1. In addition, to attach each carrier 3 with the chain to be moved together, upright posts 100 are provided to extend up from connecting points of two connected links of the chain, and two L-shaped position plates 38, 38 are fixed spaced apart on an inner side surface near the bottom of each carrier 3, having a hole in a horizontal portion to insert through the upright posts 100 of the chain 10 so that the carrier 3 is tached with the chain 10 and moved thereby at the same time, if the chain 10 is moved by the chain gear 8.

In this machine, once the various testers and meters are connected with the relative stages 40–44 of the rail 4, testing can be repeated for good, without any connecting process needed for each testing. The testing table 1 enables to shorten the time for transporting electric appliances to be tested by means of the carriers automatically moved on the testing table 1 along the first rail 4, with a worker watching testing in front of the gauge panel 6, needless to move around in testing. IN addition, the five stages of the rail are respectively electrically connected with the relative testers and meters fixed in the gauge panel in a near distance to be easily watched by the worker to check the results of testing conveniently.

Provided there are five testing stations in conventional testing procedure, five workers at least are required to make testing, not including persons for transporting electric appliances. And ten minutes at least may be needed to finish testing for one rice cooker. Using the machine in the present invention, only one worker is enough for five kinds of testing at the same time instead of five workers in the conventional testing procedure. In addition, the testing time needed for one rice cooker G may be only 45 seconds, as one round of rotation of the all appliances on all the carriers circling around on the testing table may take several minutes, finishing testing of ten or so rice cookers. Then man power needed is economized to one fifth, and the time needed is economized to about one tenth or so.

While the preferred embodiment of the invention has been described above, it will be recognized and understood that various modifications may be made therein and the appended claims are intended to cover all such modifications which may fall within the spirit and scope of the invention.

What is claimed is:

1. An automatic multi-function testing machine for electric appliances comprising:

an oval annular testing table having a flat upper surface for placing carriers described later equidistantly spaced apart thereon;

a plurality of carriers for respectively carrying an electric appliance on a flat upper surface thereof, having ball feet to move on said oval annular testing table, and having a socket fixed on an upper surface and connected by means of lead wires with first two brushes brushes described later;

an oval support base located higher inside said oval annular testing table than the level of said annular testing table and insulatingly separated by an annular aperture of proper width between the both;

a first electric rail deposited annularly under a bottom surface of said oval supporting base near its peripheral edge, having two or three lines being in contact with first two brushes;

first two brushes firmly attached with each said carrier contacting with bottom surfaces of the lines of said first electric rail, being used for various testing except temperature testing;

a gauge panel supported on said oval support base and having various testers and meters fixed with itself to let front sides of the testers and the meters to expose out of the front side thereof for watching; and one electric appliance to be tested being carried on one of said carriers, said carrier being moved annularly on said testing table by means of a moving mechanism with two electric contacts of said electric appliance electrically connected with said first electric rail via said first brushes secured on each said carrier, said first electric rail connected electrically with various testers and meters on said gauge panel, said testers and meters showing the value of tested result of the electric appliance on the carrier.

2. The automatic multi-function testing machine for electric appliances as claimed in claim 1, wherein said first electric rail has a plurality of stages separated and insulated electrically from one another.

3. The automatic multi-function testing machine for electric appliances as claimed in claim 1, wherein said gauge panel has a plurality of meters and testers respectively connected electrically with a relative stages of said first electric rail.

4. The automatic amulti-function testing machine for electric appliances as claimed in claim 1, wherein each said carrier has a testing circuit laid inside, a second electric rail is provided annularly inside said first electric rail on said oval support base, a brush holder connected with a cable connected with said testing circuit, two or more brushes fixed on said brush holder and contacting with bottom side surfaces of the lines of said second electric rail so that electric power may be supplied to said testing circuit of each said carrier.

5. The automatic multi-function testing machine for electric appliances as claimed in claim 1, wherein said moving mechanism includes an endless chain located at an inner side edge of said testing table and a chain gear having teeth engaging with said endless chain, said chain gear moving the endless chain when moved by a powwer source, said chain having a plurality of upright posts on connecting points of links and spaced apart, each said carrier having two L-shaped position plates fixed apart on an inner side surface, said L-shaped position plate having a hole in a horizontal portion to engage said upright post so that each said carrier may be moved by said chain when said chain is moved by said chain gear, running around on said testing table.

\* \* \* \* \*